United States Patent
Maccarrone et al.

[11] Patent Number: 5,859,797
[45] Date of Patent: Jan. 12, 1999

[54] BIASING CIRCUIT FOR UPROM CELLS WITH LOW VOLTAGE SUPPLY

[75] Inventors: Marco Maccarrone, Palestro; Jacopo Mulatti, Latisana; Carla Maria Golla, Sesto San Giovanni, all of Italy

[73] Assignee: SGS-Thomson Microelectronics S.r.l., Agrate Brianza, Italy

[21] Appl. No.: 846,753

[22] Filed: Apr. 30, 1997

[30] Foreign Application Priority Data

Apr. 30, 1996 [EP] European Pat. Off. .............. 96830242

[51] Int. Cl.$^6$ ...................................................... G11C 7/00
[52] U.S. Cl. ............................... 365/185.25; 365/189.09; 365/189.11
[58] Field of Search ......................... 365/185.25, 189.09, 365/189.11; 327/535, 536, 537, 538

[56] References Cited

U.S. PATENT DOCUMENTS

| | | | |
|---|---|---|---|
| 5,267,213 | 11/1993 | Sung et al. ................................. | 365/226 |
| 5,422,590 | 6/1995 | Coffman et al. ........................ | 327/537 |
| 5,642,072 | 6/1997 | Miyamoto ................................ | 327/535 |
| 5,642,073 | 6/1997 | Manning .................................. | 327/536 |

FOREIGN PATENT DOCUMENTS

| | | | |
|---|---|---|---|
| 0350462 A3 | 1/1990 | European Pat. Off. | ......... H02M 3/07 |
| 0743529 A1 | 11/1996 | European Pat. Off. | ........ G01R 31/02 |

OTHER PUBLICATIONS

Patent Abstracts of Japan, vol. 95, No. 003, JP–A–07 065589 (Toshiba Corp.), Mar. 10, 1995.

*Primary Examiner*—Vu A. Le
*Attorney, Agent, or Firm*—Allen, Dyer, Doppelt, Milbrath & Gilchrist, P.A.

[57] ABSTRACT

A circuit for generating biasing signals in reading of a redundant UPROM cell incorporating at least one memory element of the EPROM or flash type and having a control terminal and a conduction terminal to be biased, as well as MOS transistors connecting the memory element with a reference low supply voltage comprises a voltage booster for generating a first voltage output signal to be applied to the control terminal of the memory element and a limitation network for the voltage signal connected to the output of the voltage booster. There is also provided a circuit portion for generating a second voltage output signal to be applied to the control terminal of one of the above mentioned transistors. This circuit portion comprises a timing section interlocked with the voltage booster of a section generating the second voltage signal.

23 Claims, 4 Drawing Sheets

BIASING CIRCUIT FOR UPROM CELLS WITH LOW VOLTAGE SUPPLY

FIELD OF THE INVENTION

The present invention relates to a biasing circuit for low supply voltage UPROM memory cells. Specifically, but not exclusively, the present invention concerns a circuit for generating biasing signals in reading of a redundant UPROM cell incorporating at least one memory element of the EPROM or flash type, having a control terminal, and a conduction terminal to be biased, as well as MOS transistors connecting the memory element with a low voltage power supply reference.

BACKGROUND OF THE INVENTION

As known, the provision of non-volatile memory matrixes of the so-called EPROM and flash type has proved to have relatively low yields. The prior art has sought to remedy the low yield of the production process of flash memories. The solution thus far adopted consists of equipping the cell matrix with additional rows and/or columns—termed redundant—which could be used if necessary to replace rows or columns which prove defective or display malfunctions after testing of the device.

Those skilled in the art know well the design methodologies using redundant rows and columns and the associated selection circuitry. The latter allows readdressing the memory in such a manner as to replace the addresses containing defective bits with operating ones present in the redundant rows or columns.

Currently, the continuing evolution of technology and the market trend for semiconductors lead to designing memory devices capable of operating with ever lower supply voltages. This involves several significant problems due to the fact that to obtain a memory device efficient and fast in response, in particular in the reading phase, it is necessary that the redundant cells and circuitry meet certain stringent specifications. In particular, the UPROM memory cells incorporated in the selection circuitry, and which contain the binary codes of the addresses to be redundant, must be able to operate effectively even with low power supply.

In FIG. 1 is shown the basic structure of a UPROM memory cell 2 connected between a first reference power supply voltage Vcc and a second reference voltage GND, e.g. a signal ground. This UPROM comprises a memory element represented by a floating gate cell FC of the EPROM or flash type containing a binary code of an address to be redundant. This cell FC has a conduction terminal, the source terminal, directly connected to ground while another conduction terminal (drain) is connected to the power supply Vcc through a complementary pair of MOS transistors M1, M2. The basic structure of the UPROM cell 2 also comprises a first inverter I1 and a second inverter I2 each having its respective input and output terminals connected to the output and the input of the other inverter.

The first MOS transistor M1 of this complementary pair is the P-channel type and connects the input of the first inverter I1 with the power supply Vcc. The second MOS transistor M2 is the N-channel type and connects the input of the first inverter I1 with the drain terminal of the cell FC in a source follower configuration.

The control terminal of the cell FC receives a signal UGV, while to the respective control terminals G1 and G2 of the transistors M1 and M2 is applied a signal POR# and a biasing voltage signal Vb. The signal POR# represents the negated form of a power on reset signal POR. The signal POR is applied to the control terminal G3 of an enablement transistor M3 inserted between the output of the first inverter I1 and ground GND. The inverters I1 and I2 make up a register of the latch type and the transistors M1, M2 and M3 allow performance of the initialization phase of this latch.

The cell FC is programmed in the test phase, i.e. at the moment the memory devices are subjected to an Electrical Wafer Sort (EWS). Before performing any kind of operation on the memory device, the FC cells of the UPROM circuitry are read and will permit correct addressing of the memory addresses to be replaced. To be able to perform the reading it is necessary to appropriately bias the terminals of the FC cell.

Operating at low supply voltages Vcc near 2 V there arise problems for generating and managing the signals necessary for performance of the above mentioned biasing phase. The technical problem underlying the present invention is a UPROM biasing circuit cell having structural and functional characteristics such as to allow fast reading of the memory element of the UPROM cell while being able to operate with low supply voltage. This would allow overcoming the limitations and shortcomings of the present solutions proposed by the prior art for low voltage memory devices.

SUMMARY OF THE INVENTION

The present invention is directed to a biasing circuit for generating biasing signals for reading a redundant UPROM cell including at least one memory element of the EPROM or flash type and having a control terminal and a conduction terminal to be biased, and MOS transistors connecting the memory element with a reference low supply voltage. The circuit preferably includes a voltage booster for generating a first voltage output signal to be applied to the control terminal; and a limitation network connected to the output of the voltage booster for limiting the first voltage output signal. The circuit may also include a circuit portion for generating a second voltage output signal to be applied to a control terminal of one of the MOS transistors. This circuit portion may comprise a timing section interlocked with the voltage booster, and a generation section for generating the second voltage output signal.

BRIEF DESCRIPTION OF THE DRAWINGS

The characteristics and advantages of the biasing circuit in accordance with the present invention are set forth in the description of an embodiment thereof given below by way of non-limiting example with reference to the annexed drawings.

DETAILED DESCRIPTION OF THE PREFERRED EMBODIMENTS

Figure 1:
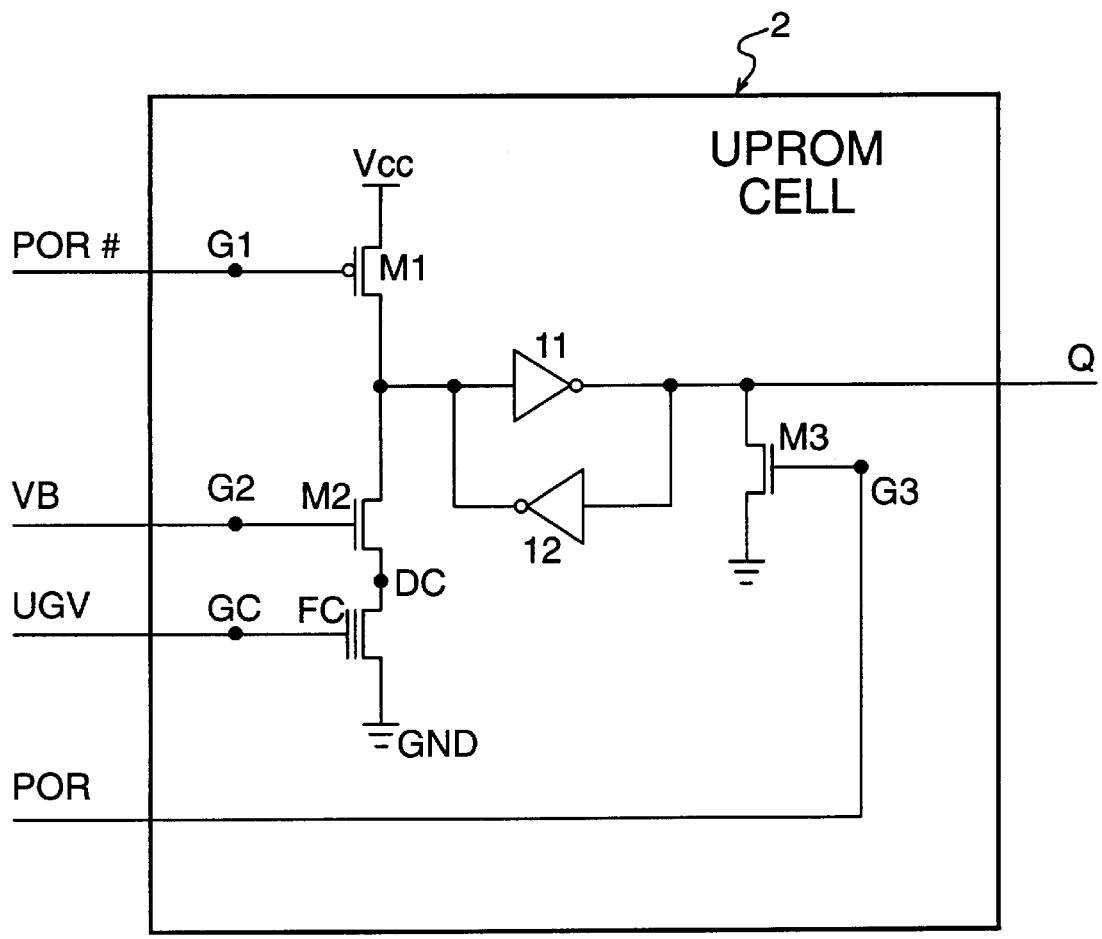
FIG. 1 shows a diagrammatic view of a UPROM memory cell incorporating a flash memory cell as in the prior art.

With reference to the FIGS. reference number 1 indicates as a whole and diagrammatically the structure of a biasing circuit provided in accordance with the present invention to supply adequate biasing voltages to a redundant UPROM cell 2. The cell 2 is integrated in a semiconductor memory device and, in particular, of the EPROM or flash type operating at low supply voltage. The memory device is not shown in the drawings but is understood to be the type comprising a memory cell matrix organized in rows and columns. With the matrix is associated conventional control, selection and decoding circuitry. The UPROM cell 2 is described above. It is only recalled that it is powered by a power supply voltage Vcc having a value of approximately 2 V.

The memory elements FC incorporated in the UPROM cells generally have a threshold voltage higher than 2 V and usually approximately 2.5 V and with low current input. Therefore, to be able to perform a reading it is necessary to boost the power supply Vcc to reach a correct voltage UGV to be applied to the control terminal of the memory element FC with a flash cell. But to perform the reading it is also necessary to supply a correct drain voltage value Vb on the cell FC to avoid electrical stresses. The drain voltage value is generally fixed at 1 V. The circuit 1 in accordance with the present invention generates the voltages UGV and Vb.

Figure 2:
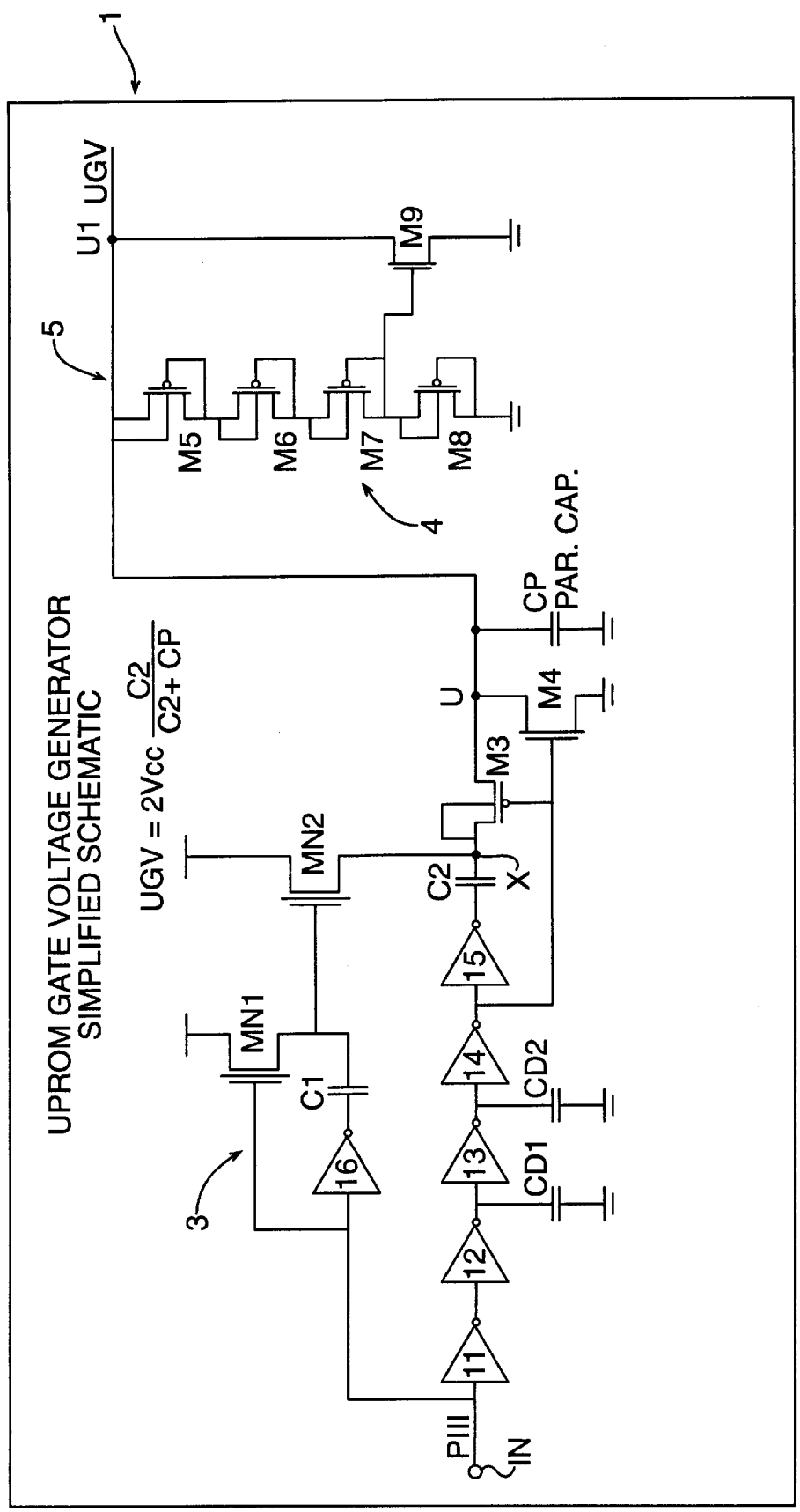
FIG. 2 shows a diagrammatic view of a detail of the biasing circuit provided in accordance with the present invention for the UPROM cell of FIG. 1.

With specific reference to the example of FIG. 2 the circuit 1 comprises an input terminal IN, a first boosting circuit portion 3, a second limitation circuit portion 5 and an output terminal U1 in cascade. The first portion 3 comprises essentially a voltage booster which takes voltage from the power supply Vcc to generate a voltage UGV augmented with respect to the power supply and to be applied to the control terminal GF of the cell FC inserted in the UPROM cell 2.

Figure 4:
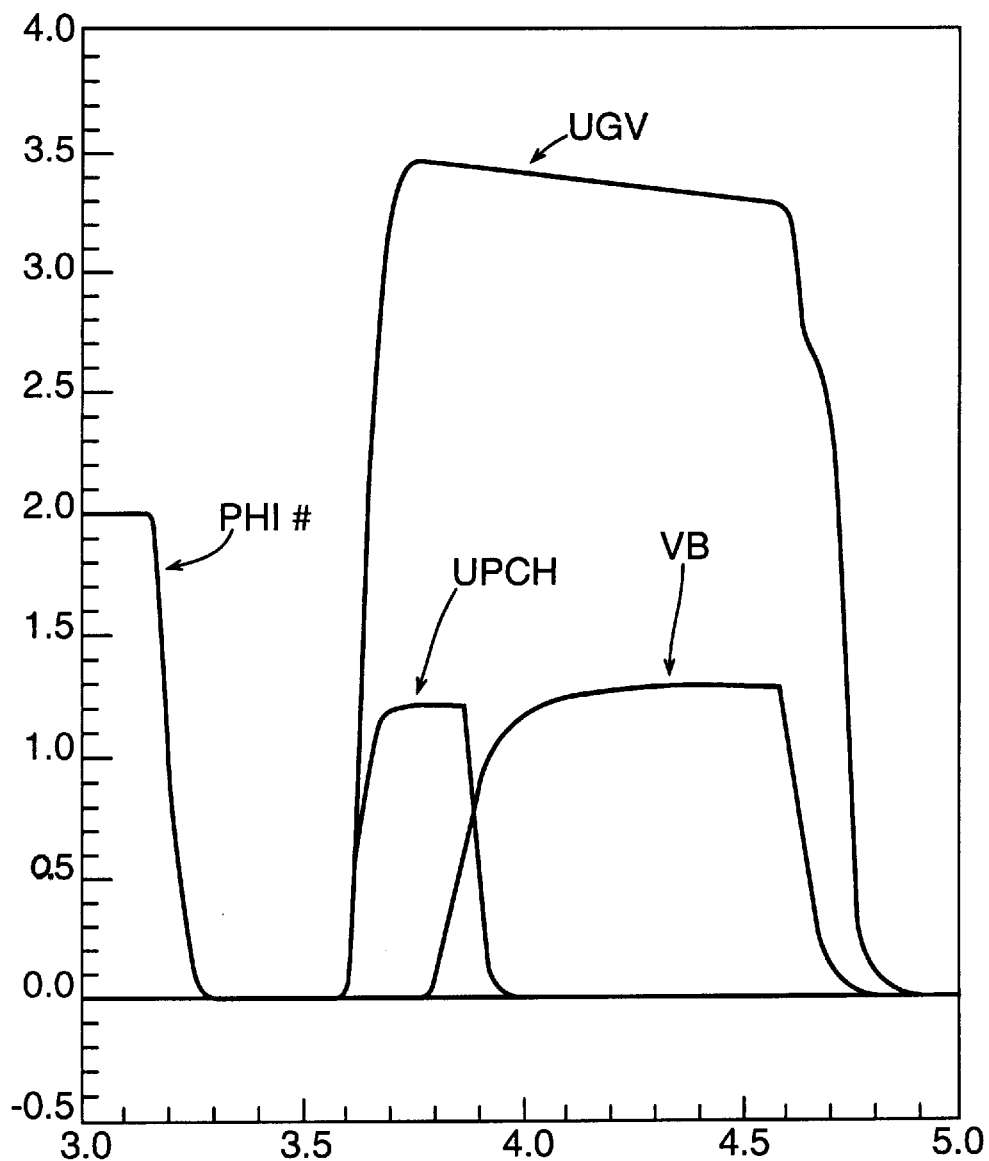
FIG. 4 shows a diagram of the behavior in time of some voltages present in the circuit of FIG. 2.

The voltage booster 3 is interlocked with an input signal PHI# which has a linear behavior as shown in FIG. 4 and is tapped from the power on reset signal POR. The voltage booster 3 comprises a series of inverters I1, I2, I3, I4, I5 which connect the input terminal IN with an output node U located upstream of the output terminal U1.

The input and the output of the third inverter I3 are connected respectively to ground GND through corresponding capacitors CD1, CD2. The output of the fourth inverter I4 produces a signal F4 and is connected to the control terminal of an N-channel MOS transistor M4 which grounds the output node U. In parallel with the transistor M4 is a parasitic capacitor CP having a relatively high value.

The output of the fifth inverter I5 produces a signal F5 applied to one terminal of a 10 pF capacitor C2 which has its other terminal connected to an intermediate node X for connection to a conduction terminal of a P-channel MOS transistor M3. This transistor M3 has its body terminal connected to the node X, its other conduction terminal connected to the output node U, and its control terminal connected to the output of the fourth inverter I4.

There is also provided a sixth inverter I6 connected in parallel with the series of inverters from I1 to I5 with its own input terminal connected to the input IN of the voltage booster 3. The output of this sixth inverter I6 produces a signal F6 and is connected to one terminal of a 0.8 pF capacitor C1 having its other terminal connected to the control terminal of a MOS transistor MN2 of the natural N-channel type. This transistor is inserted with its own conduction terminals between the power supply Vcc and the intermediate node X.

Another MOS transistor MN1 of the natural N-channel type is inserted between the power supply Vcc and the control terminal of the above transistor MN2 in order to charge the capacitor C1. In a preferred embodiment the transistors MN1 and MN2 are connected in parallel with transistors for protection from overvoltages and/or electrostatic discharges. The control terminal of the transistor MN1 receives a signal PHI# being connected to the input IN.

On the output node U of the voltage booster 3 is produced the voltage signal UGV which is limited and controlled by the second circuit portion 5 of the circuit 1. The portion 5 is essentially a limitation network comprising a divider 4 for diode-connected P-channel MOS transistors. There are provided four transistors M5, M6, M7, M8 connecting the node U with ground GND. A last transistor M9 of the N-channel MOS type connects the output terminal U1 of the circuit 1 directly to ground GND. This last transistor M9 has its control terminal connected to the control terminal of the third transistor M7 of the divider 4.

There is described below operation of the circuit 1 in accordance with the present invention. FIG. 4 shows the behavior in time of some signals mentioned in the following description. The voltage booster 3 is activated by the falling slope of the signal PHI#. When this signal has a high logical value it causes starting of the transistor MN1. At the terminals of the capacitor C1 a voltage equal to the power supply voltage Vcc less the threshold of the natural transistor MN1 (Vcc–Vt nat) is stabilized. Even the natural transistor MN2 is on and at the terminals of the capacitor C2 a voltage equal to the power supply voltage Vcc less the threshold of two natural transistors MN1 and MN2 (Vcc–2 * Vtnat) is stabilized.

When the signal PHI# falls to a low logical value the signal F6 at the output of the sixth inverter I6 reaches the value of the power supply Vcc and on the control terminal of the transistor MN2 will be present a voltage equal to twice the power supply less the threshold of a natural transistor.

This control voltage value will permit the transistor MN2 to charge the intermediate node X at a value equal to that of the power supply. At the terminals of the capacitor C2 there will be a difference in potential created just by the power supply Vcc. After a predetermined time delay set by the chain of inverters I1 to I5, and by the charge of the capacitors CD1 and CD2, the output of the fifth inverter I5 will be taken to the value of the power supply Vcc. At the same time the transistors M3 and M4 are driven to transfer the voltage generated on the intermediate node X towards the output node U and the output terminal U1 from which is delivered the boosted voltage UGV.

The maximum value which can be reached by the voltage UGV is given by:

$$UGVmax = 2 * Vcc\ [C2/(C2+CP)]$$

Thus, if the power supply Vcc is equal to 2 V with the values of C2 about 10 pF and CP approximately 2 pF, there will be obtained a UGVmax of 3.33 V. This value is more than enough to perform the reading of the cell FC.

If the voltage UGV should rise over a predetermined threshold of approximately 4 V fixed by the divider 4, the limitation network 5 would intervene to discharge the output node U to ground. In this manner there is provided protection against any overvoltages due to a power supply voltage Vcc near its upper specification limit.

Figure 3:
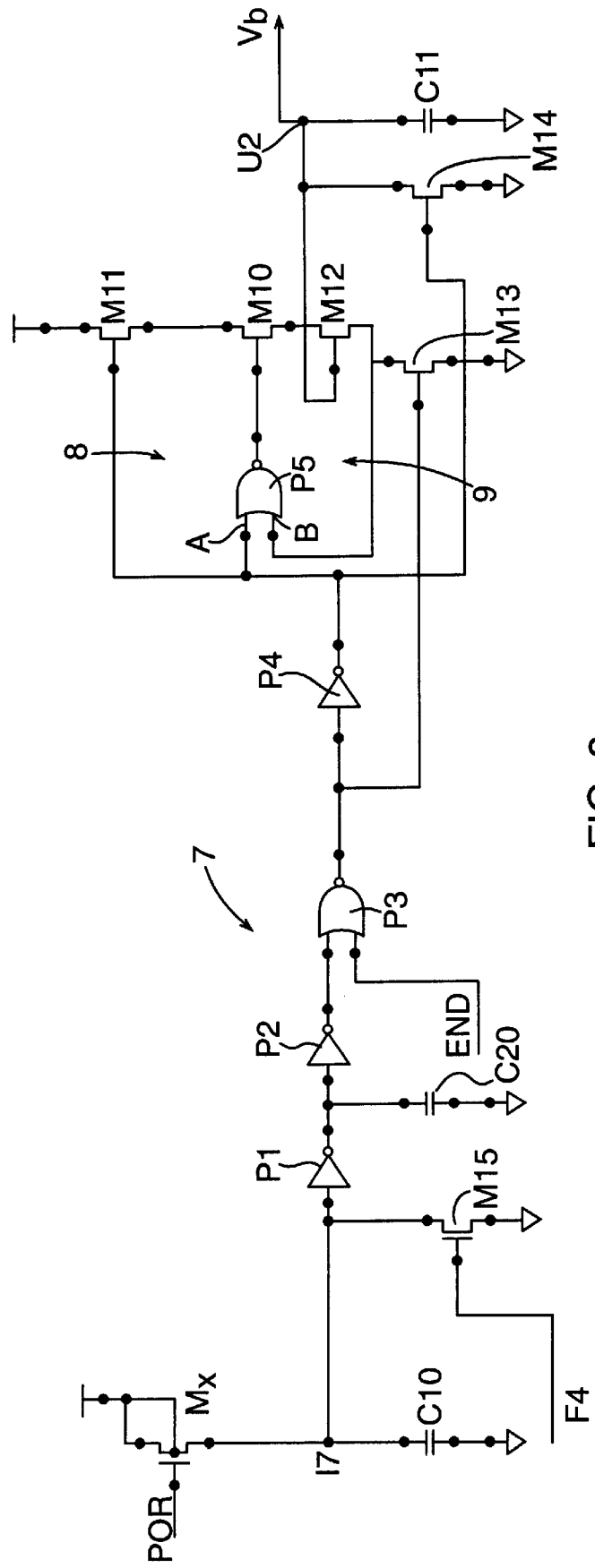
FIG. 3 shows a diagrammatic view of a detail of the biasing circuit in accordance with the present invention.

Now with particular reference to the example of FIG. 3 there is described the structure of another portion of the biasing circuit 1 in accordance with the present invention. This further portion is indicated as a whole by reference number 10 and is specifically assigned to generation of the signal vb to be applied to the control terminal of the transistor M2 of the UPROM cell 2. The voltage value Vb must be such as to hold the drain potential of the memory cell FC at approximately 1 V. It is also important that the voltage Vb not reach undesired values during electrostatic discharges. The circuit portion 10 comprises virtually two sections, to wit one 7 for timing and the other 8 for generation of the voltage vb.

The timing section 7 controls the intervention time of the remaining generation section as clarified below. The section 7 has an input terminal I7 connected to the power supply Vcc through a pull-up transistor Mx of the P-channel type. This transistor Mx is in diode configuration and receives on its control terminal a power on reset signal POR. The section 7 comprises in cascade a first inverter P1, a second inverter P2, a logical gate P3 of the NOR type and a fourth inverter P4. A second input of the logical gate P3 receives a signal END.

The input of the first inverter P1 coincides virtually with the input I7 and is connected to ground GND through a capacitor C10 in parallel with a pull-down transistor M15. The control terminal of the transistor M15 is connected to the output of the inverter I4 incorporated in the voltage booster 3 described above.

A second capacitor C20 is inserted between the input of the second inverter P2 and ground GND. Downstream of the section 7 is the generation section 8 comprising a logical gate P5 of the NOR type equipped with a feedback loop 9.

The output of the logical gate P5 of the section 8 is connected to the control terminal of a natural N-channel transistor M10 having one conduction terminal connected to the power supply through a transistor M11 and the other conduction terminal connected to ground through a transistor M12 in diode configuration connected in turn to another transistor M13. The control terminal of the transistor M11 is connected to a first input A of the gate P5 while the connection node between the transistors M12 and M13 is connected in feedback to the other input of the gate P5.

The control terminal of the transistor M13 is connected to the output of the logical gate P3 of the first section 7. Between the transistors M10 and M12 there is an output node U2 on which is taken the output voltage Vb. This output node U2 is connected to ground through a transistor M14 in parallel with a parasite capacitor C11. The control terminal of the latter transistor M14 is connected to the first input of the logical gate PS.

The operation of the circuit portion 10 is advantageously interlocked with that of the voltage booster 3. When the output signal F4 of the inverter I4 has low logical value the potential on the input I7 of the portion 10 is held at a high value by the pull-up transistor Mx. The gate P5 has one of its inputs at high logical value, and its output will consequently have a low logical value keeping the transistor M10 off. Under these conditions the transistor M14 is on and holds the output node U2 at ground value.

During the active phase of the voltage booster 3, the signal output from the fourth inverter I4 goes to high logical level to turn on the pull-down transistor M15. The input I7 falls to a low value allowing the output of the gate PS to switch in turn to the value '1'. In this manner there is turned on the transistor M10 which allows passage of current through the transistors M11, M12, M13. The voltage on the output Vb can reach the rated value fixed by the release threshold of the gate P5 and by the threshold voltage of the transistor M12.

If the voltage Vb had a value less than that indicated here the output of the gate P5 would allow the transistor M10 to conduct more current and thus increase the value of the output voltage. But if the voltage Vb were higher than the preselected value, the feedback input of the gate P5 would assume a potential value higher than the release threshold of the gate, and, thus, take the output to a low potential while turning off the transistor M10. In this manner Vb would be reduced until it reached the predetermined value.

The feedback loop formed by the logic gate P5 and by the transistors M10 and M12 have two great advantages including:

the output voltage Vb is held equal to the sum of the release threshold of the logic gate P5 and to the threshold of a natural N-channel transistor M12. The threshold of this last component is equal to approximately 0.5 V. The value of Vb remains steady even in case of power supply Vcc affected by an electrostatic discharge thanks to the presence of the control loop 9, and the charge transient of the parasitic capacitor on the output line Vb is very fast—less than 10 ns—just because of the feedback of the loop.

Before the voltage UGV at the output U1 of the circuit 1 falls to value 0 there is generated the signal END which grounds the output of the logical gate P3 in the section 7 and returns the circuit portion 8 for generation of the voltage Vb to stand-by condition. In this manner the reading cycle of the flash cells FC incorporated in the UPROM cells 2 is completed and the circuit portions 3, 5 and 10 are inhibited and have no current consumption.

The biasing circuit in accordance with the present invention solves the technical problem in a simple and effective manner to achieve numerous advantages. First, there is used a boost technique to raise the voltage UGV to be applied to the control terminals of the memory elements of the UPROM cell. The protection networks provided in the circuit in accordance with the present invention prevent dangerous overvoltages due to electrostatic discharges. There is no longer any risk of altering the information contained in the memory elements FC after spurious programming of these elements.

Turning on the circuit 1 is synchronized with the POR initialization signal which keeps the circuit in accordance with the present invention on only for the time necessary for reading the UPROM cells. In this manner there is consumed a very small stand-by current. Over all, with respect to the prior art, the circuit in accordance with the present invention allows obtaining better stability of the voltages generated and a better protection against the pulses produced by electrostatic discharges.

We claim:

1. A circuit for generating biasing signals for reading a redundant UPROM cell including at least one memory element of the EPROM or flash type and having a control terminal and a conduction terminal to be biased, and MOS transistors connecting said memory element with a reference low supply voltage, said circuit comprising:

a voltage booster for generating a first voltage output signal to be applied to the control terminal, said voltage booster comprising a plurality of inverters arranged in cascade between an input terminal and an output node;

a first at least one natural transistor connected between the reference low supply voltage and the output node that is connected to said voltage booster and having a control terminal connected to the input terminal; and a limitation network connected to the output of said voltage booster for limiting the first voltage output signal.

2. A circuit in accordance with claim 1 further comprising a circuit portion for generating a second voltage output signal to be applied to a control terminal of one of the MOS transistors, and wherein said circuit portion comprises a timing section interlocked with said voltage booster, and a generation section for generating the second voltage output signal.

3. A circuit in accordance with claim 2 wherein said voltage booster further comprises a second at least one natural transistor connected downstream from the first at least one natural transistor between the reference low supply voltage and the output node.

4. A circuit in accordance with claim 1 wherein said limitation network comprises a plurality of diode-connected transistors defining a divider.

5. A circuit in accordance with claim 4 wherein each of said plurality of diode-connected transistors are a P-channel MOS type.

6. A circuit in accordance with claim 4 wherein said limitation network comprises another transistor connected between the first output voltage signal and ground and having a control terminal connected to the control terminal of one of said plurality of diode-commuted transistors defining said divider.

7. A circuit in accordance with claim 2 wherein said timing section comprises a series of inverters and at least one logic gate connected thereto.

8. A circuit in accordance with claim 2 wherein said generation section comprises a logic gate with two inputs and with one output connected to the control terminal of a transistor with the conduction terminals of said transistor being coupled in feedback to the two inputs respectively.

9. A circuit in accordance with claim 8 wherein said logic gate is a NOR gate.

10. A circuit in accordance with claim 7 wherein the output of said generation section is connected to ground through a transistor having a control terminal connected to the output of said logic gate.

11. A circuit in accordance with claim 10 further comprises a natural N-channel transistor connected in a diode configuration and connected between the output of said logic gate and the output of said timing section.

12. A circuit for generating biasing signals for reading a redundant UPROM cell including at least one memory element of the EPROM or flash type and having a control terminal and a conduction terminal to be biased, and MOS transistors connecting said memory element with a reference low supply voltage, said circuit comprising:

a voltage booster for generating a first voltage output signal to be applied to the control terminal;

a limitation network connected to the output of said voltage booster for limiting the first voltage output signal; and a circuit portion for generating a second voltage output signal to be applied to a control terminal of one of the MOS transistors, said circuit portion comprising a timing section interlocked with said voltage booster.

13. A circuit according to claim 12 wherein said circuit portion further comprises a generation section for generating the second voltage output signal.

14. A circuit in accordance with claim 12 wherein said voltage booster comprises a plurality of inverters arranged in cascade between an input terminal and an output node, and a first at least one natural transistor connected between the reference low supply voltage and the output node and having a control terminal connected to the input terminal.

15. A circuit in accordance with claim 14 wherein said voltage booster further comprises a second at least one natural transistor connected downstream from the first at least one natural transistor between the reference low supply voltage and the output node.

16. A circuit in accordance with claim 12 wherein said limitation network comprises a plurality of diode-connected transistors defining a divider.

17. A circuit in accordance with claim 16 wherein each of said plurality of diode-connected transistors are a P-channel MOS type.

18. A circuit in accordance with claim 16 wherein said limitation network comprises another transistor connected between the first output voltage signal and ground and having a control terminal connected to the control terminal of one of said plurality of diode-connected transistors defining said divider.

19. A circuit in accordance with claim 12 wherein said timing section comprises a series of inverters and at least one logic gate connected thereto.

20. A circuit in accordance with claim 13 wherein said generation section comprises a logic gate with two inputs and with one output connected to the control terminal of a transistor with the conduction terminals of said transistor being coupled in feedback to the two inputs respectively.

21. A circuit in accordance with claim 19 wherein said logic gate is a NOR gate.

22. A circuit in accordance with claim 20 wherein the output of said generation section is connected to ground through a transistor having a control terminal connected to the output of said logic gate.

23. A circuit in accordance with claim 19 further comprises a natural N-channel transistor connected in a diode configuration and connected between the output of said logic gate and the output of said timing section.

* * * * *